United States Patent

[11] 3,612,904

[72] Inventor John L. Moe
Winona, Minn.

[21] Appl. No. 800,958
[22] Filed Feb. 20, 1969
[45] Patented Oct. 12, 1971
[73] Assignee Waynco, Inc.
Winona, Minn.

[54] SWITCHING CIRCUIT
13 Claims, 9 Drawing Figs.

[52] U.S. Cl. .......... 307/252 N, 307/246, 307/252 T
[51] Int. Cl. .......... H03k 17/00
[50] Field of Search .......... 307/252.70, 252.72, 252.73, 246

[56] References Cited
UNITED STATES PATENTS

| | | | |
|---|---|---|---|
| 3,239,692 | 3/1966 | Hedger .......... | 307/252 |
| 3,295,054 | 12/1966 | Gutzwiller et al. .......... | 307/252 X |

*Primary Examiner*—Donald D. Forrer
*Assistant Examiner*—John Zazworsky
*Attorney*—Richard J. Renk

ABSTRACT: A controllable hysteresis is introduced into a switching circuit to provide a differential between the signal level required to turn the circuit "on" and "off."

INVENTOR.
JOHN L. MOE
BY
Richard J. Renk
ATTORNEY

INVENTOR.
JOHN L. MOE

BY
Richard J. Renk
ATTORNEY

INVENTOR
JOHN L. MOE

BY Richard J. Renk
ATTORNEY

INVENTOR
JOHN L. MOE
BY
Richard J. Renk
ATTORNEY

SWITCHING CIRCUIT

BACKGROUND OF INVENTION

In control circuits it is particularly advantageous to provide a rejection of outside effects such has transients, AC line fluctuations, and ambient noise. These effects when not properly suppressed or rejected can cause many symptoms of poor control such as false triggering, relay chatter and other undesirable characteristics.

Most particularly, the solid state devices such as the silicon controlled rectifiers and transistors are very susceptible to outside effects because they are extremely sensitive and do not have an inherent hysteresis or discriminating differential between their "on" and "off" points.

SUMMARY OF THE INVENTION

The present invention overcomes the problem of outside effects on control circuits by introducing a controlled hysteresis characteristic. Basically, the controlled hysteresis is accomplished by a delayed feedback to the control elements of the circuit. The net effect is to predetermine the signal level required to turn the switching circuit "on" and the reduction in the signal necessary before the circuit will be turned "off."

PREFERRED EMBODIMENTS

Figure 1:
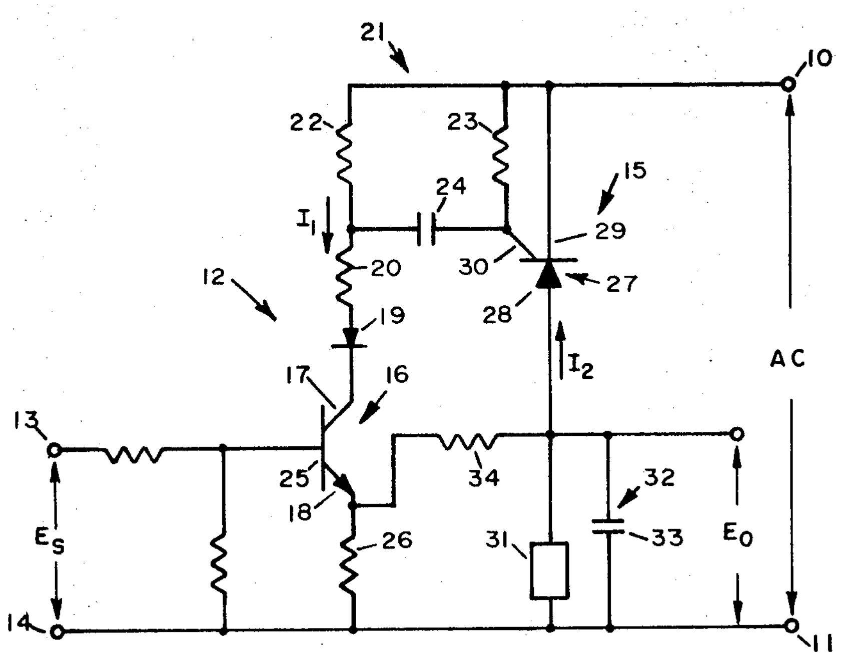
FIG. 1 is a schematic view of one embodiment of the switching circuit.

Reference is now made to the drawings and to the embodiment of the invention shown in FIG. 1. Generally the switching circuit includes an AC supply source across terminals 10 and 11, a first control circuit 12, a signal circuit across terminals 13 and 14, and a power control circuit 15.

The circuit 12 includes a first control means such as a semiconductor transistor 16. The transistor has its power circuit including collector 17 and emitter 18 across the AC supply voltage.

Specifically, collector 17 is coupled serially to a protecting diode 19, a current limiting resistor 20, and thence to a first charging or triggering circuit 21. The charging circuit 21 is coupled to AC supply terminal 10 and includes a resistor 22 paralleled by a resistor 23 and capacitor 24.

To complete the first control circuit 12, transistor 16 has its base 25 coupled to signal terminal 13 and has its emitter 18 connected through a resistor 26 to line 11. When transistor 16 is conducting, current will flow in the direction of arrows $I_1$.

The signal applied across terminals 13 and 14 may be in the nature of an error signal $E_s$ as detected by various methods. For example, transducers such as resistance, thermocouple, pressure, light humidity, etc., may be employed. These may be used in conjunction with known transmission means to relay an error signal to the signal circuit 13–14 when a system being controlled is deviating from a specified control or setpoint.

Reference is now made to the second control circuit indicated generally at 15. Such circuit includes a second control means 27 such as a semiconductor device of the silicon-controlled rectifier (SCR) variety having a power circuit with an input or anode terminal 28 and an output or cathode terminal 29. The control circuit of the SCR includes a gate 30 coupled to capacitor 24 of charging circuit 21.

SCR 27 has its power circuit connected across the AC supply with anode 28 serially connected to a load indicated at 31 and thence to AC line 11. Cathode 29 is connected to AC terminal 10. The conductive polarity of the SCR power circuit is reversed with respect to that of transistor 16 and current will flow only in the direction shown by arrow $I_2$.

Another charging circuit 32 is provided in conjunction with the power control circuit 15. This second charging circuit includes a filter capacitor 33 across the load 31. The filter capacitor voltage indicated at $E_o$ is then applied to transistor emitter 18 through a divider resistor 34.

In operation, when an error signal voltage $E_s$ is applied across terminals 13 and 14 such that terminal 13 is positive of a predetermined magnitude, transistor 16 will conduct. If the signal voltage is below the predetermined level or of opposite polarity it will not conduct.

With transistor 16 conducting and AC supply terminal 10 positive with respect to terminal 11, current $I_1$ will flow in the transistor power circuit. Current $I_1$ will produce a voltage across resistor 22 which in turn will charge capacitor 24 through resistor 23.

When the AC supply voltage reverses and terminal 10 is negative with respect to terminal 11, two conditions can occur for SCR 27. First, if capacitor 24 has accumulated sufficient charge to satisfy the requirements of SCR gate 30 to trigger the SCR 27, as the AC supply terminal 10 becomes negative with respect to terminal 11, SCR 27 will turn on immediately. Second, if capacitor 24 does not receive sufficient charging voltage to trigger SCR 27, no output will appear across load 31.

Figure 3:
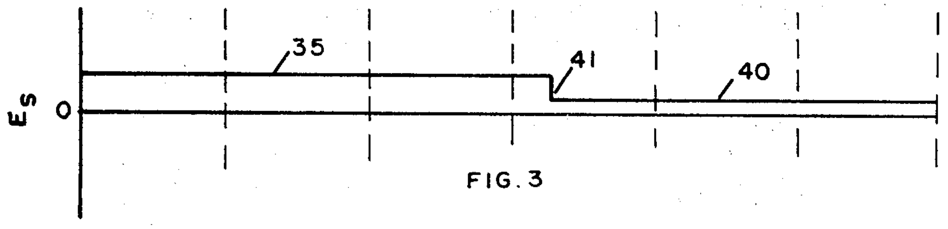
FIG. 3 is a waveform of the signal voltage which may be used to activate the circuit of the invention.

For purposes of illustration, assume that the signal voltage $E_s$ is at a sufficient level to trigger transistor 16 as indicated as 35 in FIG. 3. Also assume the AC supply voltage is such that terminal 10 is positive with respect to terminal 11 as at 36 in FIG. 4. Such being the case, current $I_1$ with a waveform and magnitude as shown at 37 (FIG. 5) will flow through transistor 16 and capacitor 24 will be charging.

Figure 6:
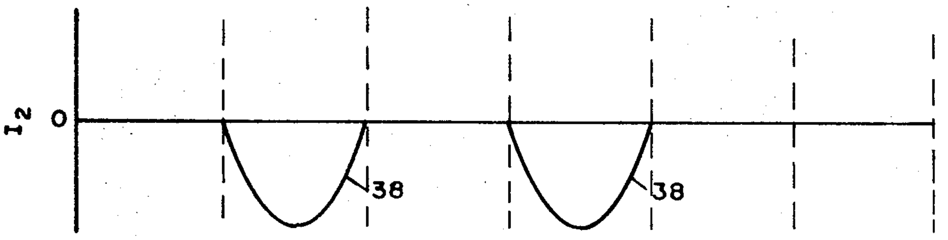
FIG. 6 is a curve showing current flow in a power or second control means of the circuit.

Assuming capacitor 24 has charged sufficiently, SCR 27 will turn on immediately as the AC line voltage reverses and terminal 10 becomes negative with respect to terminal 11. Current $I_2$ through load 31 and SCR 27 will be as shown at 38 in FIG. 6. It will be 180° out of phase with respect to current $I_1$ through transistor 16. This will cause an output voltage $E_o$ to appear across load 31 and capacitor 33.

Figure 4:
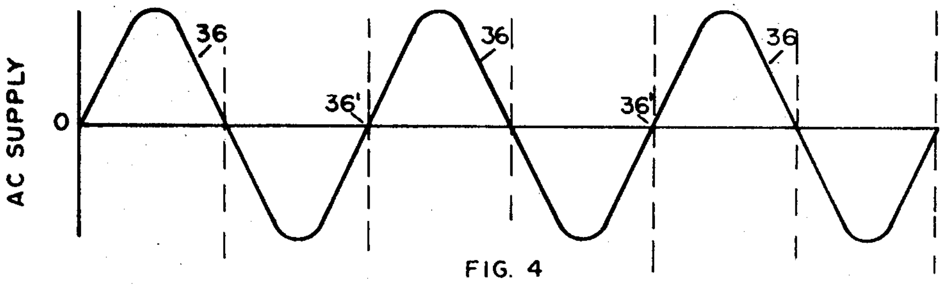
FIG. 4 is a typical AC voltage waveform.

Voltage $E_o$ is then applied to the emitter 18 of transistor 16 through divider resistor 34. The time constant of capacitor 33 and the load 31 is made long as compared to the period of the AC supply so that the voltage $E_o$ is still present as the AC supply again turns positive as at 36′ (FIG. 4).

The effect of applying the negative voltage $E_o$ to the transistor emitter 18 is the same as applying more positive input voltage to the transistor's base 25. This causes the current $I_1$ to increase as shown at 39 (FIG. 5) on the next AC supply cycle when terminal 10 is again positive with respect to terminal 11.

Now, in accordance with the invention, to turn the first control circuit 12 off by reducing $I_1$, the error signal voltage $E_s$ must be reduced as shown at 40 (FIG. 3). The amount of reduction required is equivalent to the net positive feedback voltage applied to transistor emitter 18.

The difference in error signal voltage required to turn the switching circuit "on" and "off" is the hysteresis of the circuit and is shown by vertical line 41 (FIG. 3). It is this difference which makes it difficult for AC line fluctuations to turn the circuit off because of the low voltage drop required before capacitor 24 will fail to gain sufficient charge to trigger SCR 27. Contrariwise, the tendency for transients and ambient noise levels to turn the circuit on is drastically curtailed since these effects do not charge capacitor 24 sufficiently. Consequently, the symptoms of false triggering, relay chatter and other undesirable characteristics are reduced.

Figure 5:
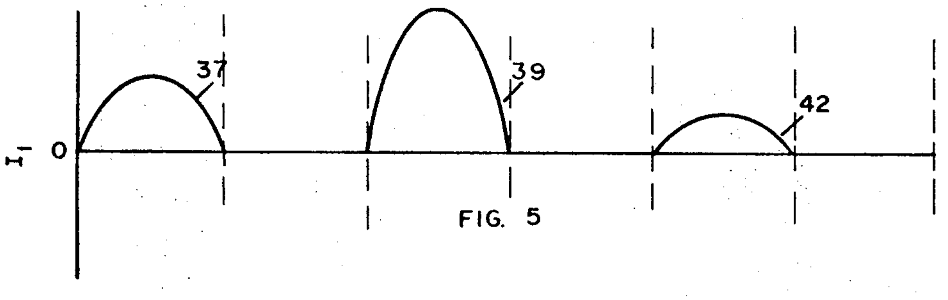
FIG. 5 is a curve depicting the current flow in a first control means of the circuit.

When the first control circuit 12 is turned off by virtue of error signal $E_s$ dropping to the level indicated at 40 (FIG. 3), current $I_1$ through transistor 16 will drop as shown at 42 (FIG. 5). This is insufficient to charge capacitor 24 to the level required to trigger SCR 27. Thus, SCR 27 will not fire. Therefore as shown in FIG. 5, no load current $I_2$ is present and the power control circuit 15 is deenergized.

To increase the differential or hysteresis 41 in the signal level required to turn the first control circuit 12 "on" and "off," voltage $E_0$ feedback to transistor emitter 18 must be increased. This is accomplished by decreasing the resistance ratio of resistor 34 to resistor 26.

A decrease in the hysteresis 41 is achieved by increasing the ratio of resistor 34 to resistor 26.

It will be obvious that the present invention achieves several unique advantages. One is that it provides a means of introducing a controlled hysteresis into a circuit. Another is that the power circuit is switched at the zero crossings of an AC supply when the anode of the SCR 27 is turning positive with respect to the cathode. Thus, full half-cycle power is supplied to the load with its inherent advantage of eliminating radio frequency interference because of the zero switching characteristic.

Figure 2:
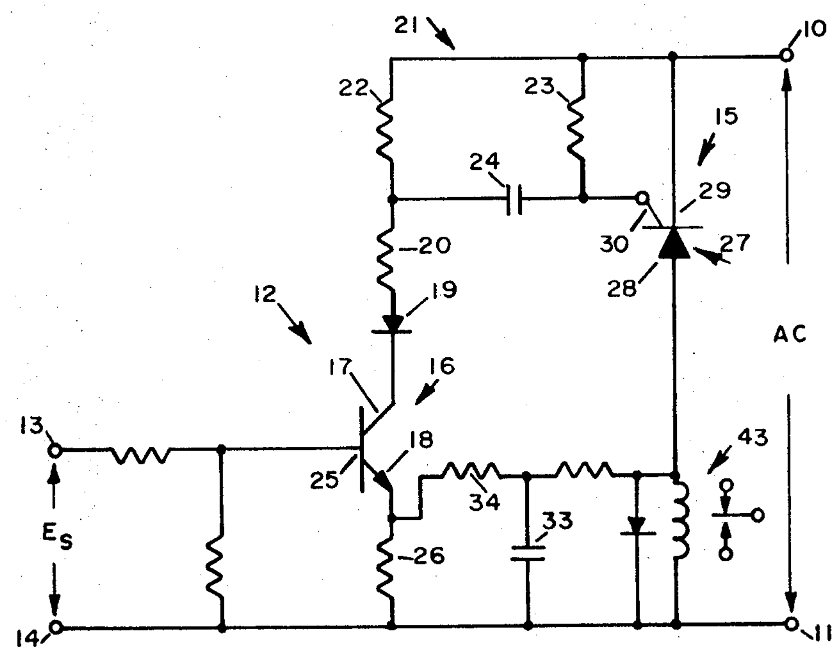
FIG. 2 is a schematic diagram of another embodiment of the invention incorporating a power relay or contactor.

An alternate embodiment of the invention is shown in FIG. 2 wherein the concepts of the invention are used in conjunction with a power relay or contactor 43.

Figure 7:
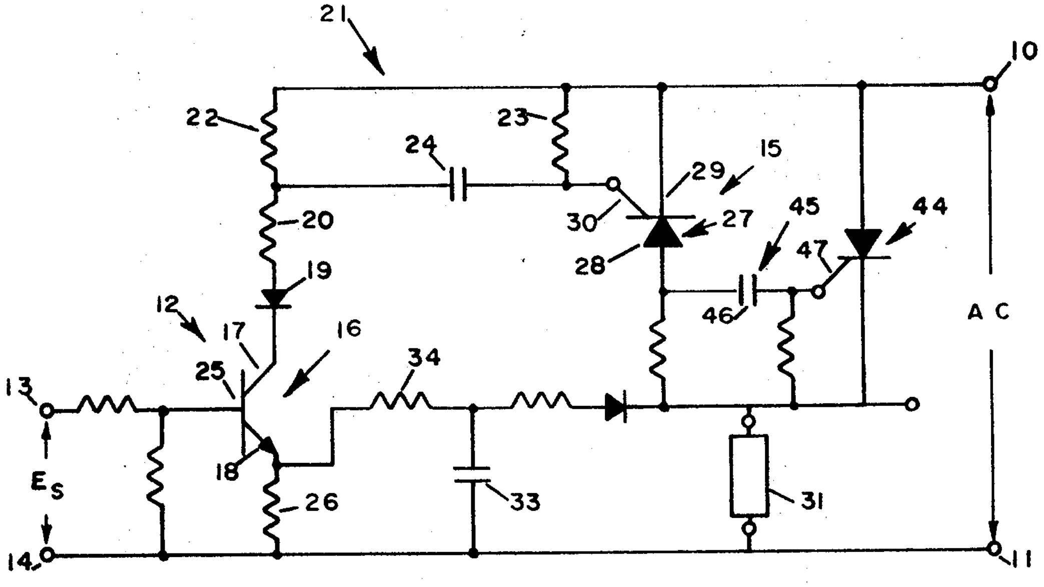
FIG. 7 is a schematic diagram depicting another embodiment of the invention showing the concepts of the invention in a circuit providing full-wave AC output to a load.

Another embodiment of the invention is shown in FIG. 7 wherein a full-wave AC output is achieved across the load by utilizing an additional SCR 44 back-to-back with the SCR 27. A third charging or triggering circuit 45 similar in function to charging circuit 21 is utilized to trigger SCR 44.

Charging circuit 45 includes a capacitor 46 coupled to gate 47 of SCR 44. This circuit charges while SCR 27 is conducting. Then, on opposite half cycles, SCR 44 will conduct while circuit 21 is charging during conduction of transistor 16. Power to load 31 is therefore full wave AC and turns off and on at the zero crossings of the AC supply.

In other words, complete full cycles of AC power will always be applied to the load. Once SCR 27 has fired, capacitor 45 will charge automatically even though transistor 16 might have switched off in the meantime. Consequently, the sequence always ends with SCR 44 firing last and the polarity of the switching circuit as it turns off will always be known. This is important, for example, where it is desirable to know the magnetic state of a transformer, etc.

Figure 8:
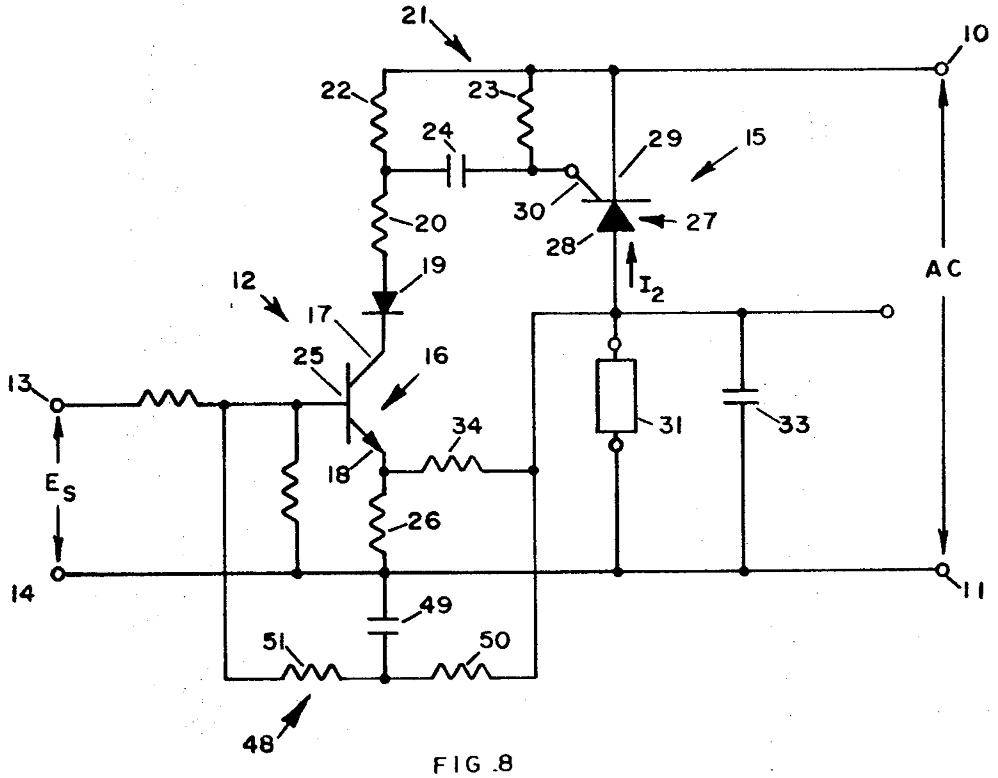
FIG. 8 is a schematic diagram of the invention showing a further embodiment wherein the features of the invention are incorporated in a time-proportional circuit.

A further embodiment is shown in FIG. 8 wherein the concepts of the invention are incorporated in a time-delay negative feedback circuit for proportional control. Such circuit provides a timed cycling of the power applied to the load with the ratio of "on" to "off" time increasing as the error signal $E_s$ increases.

Specifically, this embodiment includes a negative feedback circuit 48 having a capacitor 49 which is charged when current $I_2$ flows through the load 31, i.e., when SCR 27 is conducting. Charging is accomplished through a resistor 50 coupled to the common junction between capacitor 33, load 31 and divider resistor 34. The output voltage of capacitor 49 is then applied as negative feedback to transistor base 25 through a resistor 51. While it may be varied, the time-constant of capacitor 49 and resistor 50 is longer than that of capacitor 33. As a result, capacitor 49 is charged slowly whereas capacitor 33 charges almost instantaneously during a single cycle.

In operation the negative feedback circuit 48 may vary the "on" to "off" time of the switching circuit from 0 to 100 percent in conjunction with the hysteresis or differential 41 (FIG. 3). If the error signal $E_s$ is strong and terminal 13 is positive with respect to terminal 14, the error signal will override the negative feedback signal from circuit 48. Transistor 16 will then conduct in regular half-cycle intervals causing SCR 27 to conduct at alternate half-cycle intervals thereby supplying power to the load.

As the system being controlled begins to approach its control point, the error signal $E_s$ will be reduced gradually. The voltage of the negative feedback circuit 48 will then cancel the error signal to the dropout level indicated at 40 in FIG. 3. This will turn off transistor 16. In turn, SCR 27 will be off and the negative feedback circuit 48 will cease charging and its voltage will decay. When the error signal $E_s$ again exceeds the negative feedback voltage at the level indicated at 35 (FIG. 3), transistor 16 will again conduct and turn on SCR 27 through triggering circuit 21. This will recharge the negative feedback circuit 48.

If the error signal $E_s$ is still relatively high, the time for circuit 48 to reach sufficient voltage to cancel out the error signal $E_s$ to the turnoff value 40 (FIG. 3) will be relatively long. Therefore the switching circuit will be "on" longer.

As the switching circuit approaches its control point it will have a lower error signal and the circuit will turn off sooner and remain off longer. The result is proportional control on a time basis utilizing the controlled hysteresis concepts of the invention.

Another means of achieving time-proportioning is to use an external sweep circuit to modulate the error signal and apply a timed-cycling output to the load. This may take the form of a programable unijunction transistor as a sweep generator which applies a time varying ramp voltage across a timing capacitor as a modulating signal. The positive ramp voltage is then used to turn on the circuit until the unijunction transistor is fired to discharge the ramp voltage.

Figure 9:
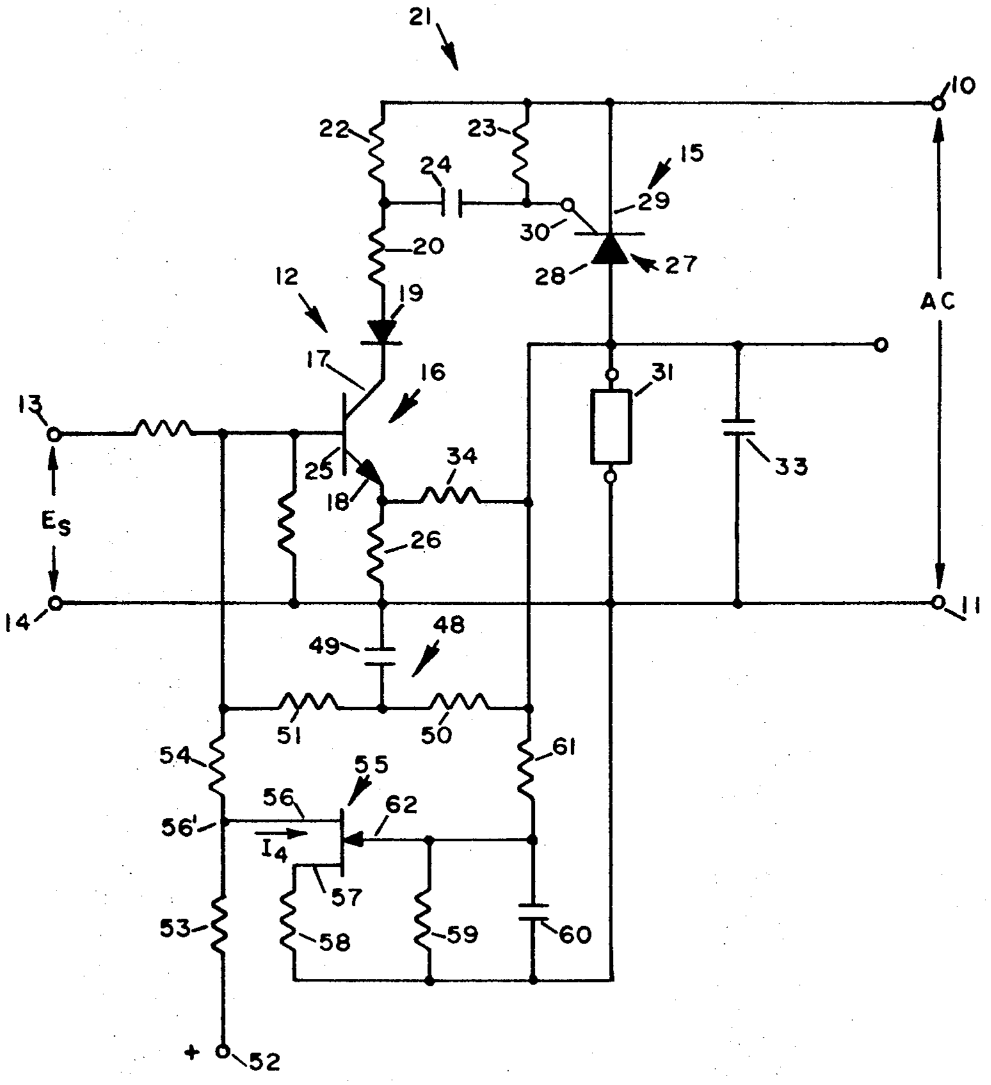
FIG. 9 is a schematic diagram of an additional embodiment utilizing the invention in a time-proportioning circuit with automatic reset.

The concepts of the invention are further applied in another embodiment illustrated in FIG. 9 wherein automatic reset is used in conjunction with the proportional control of FIG. 8. As is well known, proportional control has a characteristic of set point "droop," i.e. it is almost always slightly under the desired control point. Because of this characteristic, in order to maintain a given output, it is necessary that the control operate slightly off from the true system null in order to proportion.

To adjust for set point droop, a separate or reset signal is generated which is proportional to the time integral of the error signal. This signal is then summed with the proportional error signal from negative feedback circuit 48. Slowly as a function of time, the reset signal is summed with the actual error signal and the summed signal is substituted for the actual error signal. When the system being controlled is at its control point, the actual error signal will be zero. At this time, only the reset signal remains to provide proportional control of the output power.

In the present embodiment, the reset error signal is supplied from a positive DC terminal 52, through a resistor 53 and a summing resistor 54, to transistor base 25. The amount of reset signal applied to transistor base 25 is controlled by bleeding a portion of the reset signal through a field-effect transistor 55. Such transistor has its drain 56 tied to the junction 56' between the resistors 53 and 54, and its source 37 coupled through a resistor 58 to common line 11. The gate 62 of the field-effect transistor 55 is connected to the other side of resistor 59 and to a capacitor 60.

Whenever power control circuit 15 is conducting, capacitor 60, which is coupled across load 31, is slowly charged through resistors 61 and 59. The longer control circuit 15 is conducting, the higher capacitor 60 will be charged.

Voltage of capacitor 60 is then applied to field-effect transistor's gate 62. The greater the voltage applied to gate 62, the less drain current $I_4$ (FIG. 9) that will flow through the field-effect transistor. Hence, the greater will be the reset signal applied to transistor base 25 via resistor 54.

Different duty cycles of the control circuit 15 will vary the positive voltage level appearing at point 56' with respect to common line 11. When circuit 15 is off, capacitor 60 will discharge, and as its voltage decreases, field-effect transistor 55 will conduct more and the voltage at point 56' will then drop and the reset signal will decrease.

For every duty cycle, that is, for every "on" to "off" time ratio of the switching circuit, different magnitudes of voltage will be integrated on capacitor 60. As the actual error signal applied to terminals 13 and 14 is maintained at zero, the proper load duty cycle will be maintained. Thus, by providing a reset signal, the load is maintained at its set point and the input error signal relayed to the terminals 13 and 14 will be reduced towards "zero." Depending on the duty cycle, the amount of reset will be adjusted by the charge on capacitor 60. Thus in this embodiment, the benefits of proportional control and reset are combined with the hysteresis concepts of the invention.

While a transistor has been shown as the first control means, other devices can be substituted such as a field-effect transistors, vacuum tubes, light dependent resistors, Hall-effect devices, saturable core reactors and SCR's. Also, while an SCR has been shown for the power or second control means, triacs, thyratrons, magnetrons and other devices may be used, particularly those which may be triggered by a pulse-type signal.

The invention has many applications such as in controlling temperature, pressure, humidity, etc. While the error signal $E_s$ is generally of the DC type, an AC signal phased so that transistor base 25 and power terminal 10 go positive at the same time could also be used. In this form it becomes a phase sensitive detector with switching output.

It is of course to be understood that the embodiments of the invention are for purposes of illustration only and that the scope of the invention is to be limited solely by the following claims

What I claim is:

1. In a switching circuit, a. a first control means having a power circuit and a control circuit, b. means for connecting a signal source to the control circuit of said first control means, c. a first charging circuit, d. a second control means having a power circuit and a control circuit, e. a second charging circuit functioning to charge when said second control means is conducting, f. said first charging circuit being coupled to the control circuit of said second control means and also being coupled to the power circuit of said first control means so as to charge when said first control means is conducting, said first charging circuit serving to activate said second control means upon reaching a predetermined level, g. said second charging circuit being coupled to the power circuit of said first control means and when having a charge lowering the signal level required to keep said first control circuit turned on.

2. In a switching circuit having a controlled hysteresis between the turn on and turnoff points, a. an AC power source, b. a first control means having a power circuit and a control circuit, said AC power source being coupled to said power circuit of said first control means, c. means for connecting a signal source to the control circuit of said first control means, d. a first charging circuit coupled to the power circuit of said first control means and serving to charge when said signal source reaches a predetermined level and causes said first control means to conduct, e. a second circuit means having a control and a power circuit with the power circuit thereof being coupled to said AC power source, f. said first charging circuit being coupled to the control circuit of said second control means and serving to cause said second control means to conduct when the first charging circuit reaches a predetermined level, g. a second charging circuit functioning to charge when said second control means is conducting, and h. means coupling said second charging circuit to the power circuit of said first control means when the latter is conducting to thereby require a different signal level to turn said first control means off than is required to turn it on.

3. A switching circuit as claimed in claim 2 wherein said second control means is an SCR and the gate thereof is coupled to said first charging circuit.

4. A switching circuit as claimed in claim 2 wherein said first control means is a transistor having an emitter and a collector in the power circuit thereof and wherein said second charging circuit is coupled to the power circuit of said transistor.

5. A switching circuit as claimed in claim 2 wherein a load is connected to the power circuit of said second control means and said second charging means includes a capacitor coupled across said load.

6. A switching circuit as claimed in claim 2 wherein a third control means having control and power circuits is connected in back-to-back relationship with said second control means, and wherein a third charging circuit is provided which is charged when said second control means is conducting, and wherein said third charging circuit is coupled to the control circuit of said third control means.

7. A switching circuit as claimed in claim 6, wherein said second and third switching means are semiconductor devices.

8. A switching circuit as claimed in claim 2, wherein means are provided for varying the on to off time of the switching circuit by canceling at least a portion of the signal supplied to said control circuit of said first control means.

9. A switching circuit as claimed in claim 8, wherein said means for canceling a portion of said signal includes a charging circuit which is charged from the power circuit of said second control means and in turn applies a canceling voltage to said signal applied to the control circuit of said first control means.

10. A switching circuit as claimed in claim 9 wherein means are provided for applying a reset signal to said first control means.

11. In a switching circuit having a controlled differential between its turn on and turnoff points, a. a power source, b. a first control means having a power circuit and a control circuit, said first control means having its power circuit coupled to said power source, c. means for connecting an error signal to said control circuit of said first control means, d. a second control means, e. said first control means and said second control means being operably connected to conduct approximately 180° out of phase with respect to one another, f. means coupled to the power circuit of said first control means and to said second control means for activating said second control means when said first control means has conducted at a predetermined level, and g. means activated when said second control means is conducting and coupled between said second control means and the power circuit of said first control means to increase the power conducted through the power circuit of said first control means when the latter is conducting to thereby require a predetermined drop in error signal applied to said control circuit of said first control means before said switching circuit will turn off.

12. A switching circuit as claimed in claim 11 wherein said means to increase the power in said first control means is applied as a positive feedback voltage to the power circuit of said first control means.

13. A switching circuit as claimed in claim 11 wherein said power source is AC and means are provided for switching said circuit on and off at the zero voltage crossing of the said AC source.